United States Patent
Kim et al.

(10) Patent No.: US 10,284,001 B2
(45) Date of Patent: May 7, 2019

(54) COMPOSITE MAGNETIC SHEET AND WIRELESS CHARGING MODULE COMPRISING SAME

(71) Applicant: LG Innotek Co., Ltd., Seoul (KR)

(72) Inventors: So Yeon Kim, Seoul (KR); Sang Won Lee, Seoul (KR); Jong Hyuk Lee, Seoul (KR); Seok Bae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/515,468

(22) PCT Filed: Sep. 25, 2015

(86) PCT No.: PCT/KR2015/010168
§ 371 (c)(1),
(2) Date: Mar. 29, 2017

(87) PCT Pub. No.: WO2016/052939
PCT Pub. Date: Apr. 7, 2016

(65) Prior Publication Data
US 2017/0244271 A1    Aug. 24, 2017

(30) Foreign Application Priority Data
Sep. 29, 2014    (KR) .................... 10-2014-0129883

(51) Int. Cl.
*H02J 7/00* (2006.01)
*H01F 27/245* (2006.01)
(Continued)

(52) U.S. Cl.
CPC .......... *H02J 7/025* (2013.01); *H01F 1/14741* (2013.01); *H01F 1/14791* (2013.01);
(Continued)

(58) Field of Classification Search
None
See application file for complete search history.

(56) References Cited

U.S. PATENT DOCUMENTS 5,750,251 A    5/1998    Ohji
2002/0141119 A1*    10/2002    Saito .................... B82Y 10/00
360/319

(Continued)

FOREIGN PATENT DOCUMENTS

CN    1855623 A    11/2006
JP    H06318516 A    11/1994
(Continued)

OTHER PUBLICATIONS

International Search Report in International Application No. PCT/KR2015/010168, filed Sep. 25, 2015.
Office Action dated Dec. 5, 2018 in Chinese Application No. 201580052843.9, along with its English translation.

*Primary Examiner* — Kevin M Bernatz
(74) *Attorney, Agent, or Firm* — Saliwanchik, Lloyd & Eisenschenk

(57) ABSTRACT

The present invention relates to an electromagnetic shielding sheet capable of improving reliability. Particularly, the present invention provides a composite magnetic sheet for electromagnetic shielding structured such that an independent soft magnetic sheet, which has a low surface roughness, is laminated on the outermost surface of a soft magnetic sheet having a lamination structure, thereby implementing laminated composite sheets having different surface roughness or porosity characteristics; as a result, the reliability in an external hazardous environment, such as saline water, can be substantially enhanced while maintaining the efficiency of electromagnetic shielding.

18 Claims, 4 Drawing Sheets

(51) Int. Cl.
  *H02J 7/02* (2016.01)
  *H01F 1/147* (2006.01)
  *H01F 1/36* (2006.01)
  *H01F 27/28* (2006.01)
  *H01F 38/14* (2006.01)
  *H01F 1/26* (2006.01)
  *H01F 27/36* (2006.01)
  *H02J 50/10* (2016.01)
  *H02J 50/70* (2016.01)

(52) U.S. Cl.
  CPC ............. *H01F 1/26* (2013.01); *H01F 1/36* (2013.01); *H01F 27/245* (2013.01); *H01F 27/2804* (2013.01); *H01F 27/365* (2013.01); *H01F 38/14* (2013.01); *H02J 50/10* (2016.02); *H02J 50/70* (2016.02); *H01F 2027/2809* (2013.01)

(56) References Cited

U.S. PATENT DOCUMENTS

2006/0266435 A1* 11/2006 Yang ............... G06K 19/07771
  148/105
2009/0243780 A1* 10/2009 Inoue ................. H01F 1/15366
  336/200
2014/0070766 A1* 3/2014 Tabata .................. H02J 7/025
  320/108

FOREIGN PATENT DOCUMENTS

| JP | 2008210862 A | * | 9/2008 | ............ H01F 27/36 |
| JP | 2009283820 A | | 12/2009 | |
| KR | 100460297 B1 | | 12/2004 | |
| KR | 1020140044022 A | | 4/2014 | |
| KR | 1020140109336 A | | 9/2014 | |
| KR | 1020140109336 A1 | * | 9/2014 | ............... H01Q 7/04 |

\* cited by examiner

FIG. 4

|  | A11 Type | A1 Type | MODULE + BATTERY | MODULE |
|---|---|---|---|---|
|  | Max | Max | 100kHz | 100kHz |
|  | [%] | [%] | [WPC uH] | [WPC uH] |
| UPPER/ LOWER PORTIONS ARE NOT CRACKED | 65.9% (64.1-67.3) | 62.9% (60.8-63.9) | 11.27 | 11.93 |
|  | 0.0 | 0.0 | 0.1 | 0.1 |
|  | 1.6% | 1.7% | 0.9% | 1.0% |
| UPPER PORTION IS NOT CRACKED | 69.9% (68.7-70.6) | 66.3% (65.0-67.3) | 11.25 | 11.93 |
|  | 0.0 | 0.0 | 0.0 | 0.0 |
|  | 0.8% | 1.0% | 0.2% | 0.2% |
| BOTH UPPER/ LOWER PORTIONS ARE CRACKED | 70.5% (69.8-70.9) | 67.4% (66.9-68.3) | 11.21 | 11.85 |
|  | 0.0 | 0.0 | 0.0 | 0.1 |
|  | 0.5% | 0.5% | 0.3% | 0.5% |

COMPOSITE MAGNETIC SHEET AND WIRELESS CHARGING MODULE COMPRISING SAME

CROSS-REFERENCE TO RELATED APPLICATION

This application is the U.S. national stage application of International Patent Application No. PCT/KR2015/010168, filed Sep. 25, 2015, which claims priority to Korean Application No. 10-2014-0129883, filed Sep. 29, 2014, the disclosures of each of which are incorporated herein by reference in their entirety.

TECHNICAL FIELD

The present disclosure relates to an electromagnetic shielding sheet using which reliability is improved.

BACKGROUND ART

Recent developments of electromagnetic shielding sheets for wireless power transmission have been dominantly made for the purpose of achieving high efficiency and thinness. In other words, a magnetic material is used in an information technology (IT) component module for wireless power transmission, and owing to the use of such a magnetic material, an effort to enhance a function and performance of transmission efficiency (that is, wireless power transmission efficiency) has continued to minimize an electromagnetic energy loss by using an electromagnetic shielding material (that is, a magnetic substance) due to the use of such a magnetic material in addition to a practice of relying on only a coil design.

In terms of a shielding material configured with a magnetic substance, a shielding material capable of satisfying a function of wireless power transmission is necessary, and such a shielding material has a limitation in compatibility due to a diversification of standard methods for wireless power transmission. Typical examples of such standard methods for wireless power transmission include a wireless power consortium (WPC) method, an alliance for wireless power (A4WP) method, and a power matters alliance (PMA) method, and the standard methods are technically classified into magnetic induction methods and magnetic resonance methods.

A thin-film type metallic alloy which is implemented with a typical applicable magnetic material is attracting attention as such a shielding material, but excessively high permeability, which is realized by such a thin-film type metallic alloy, adversely affects impedance matching with an electromagnetic coil, and thus it is necessary to adjust permeability thereof.

Specifically, when a process, such as a cracking process, is performed on a thin-film type metallic alloy to adjust such permeability, burrs or fragments occur on the thin-film type metallic alloy itself, and thus damage to a surface or appearance thereof occurs, thereby causing a problem in which reliability is significantly degraded in an external hazardous environment due to the penetration of salt water and the like.

DISCLOSURE

Technical Problem

Embodiments of the present disclosure are provided to address the above-described problem, and particularly, in accordance with the embodiments of the present disclosure, composite sheets of a stacked structure, which have characteristics of different surface roughness or different porosity, are implemented, thereby providing a composite magnetic sheet for electromagnetic shielding which has a structure capable of significantly enhancing reliability in an external hazardous environment such as salt water and the like while maintaining efficiency of the electromagnetic shielding.

Technical Solution

To address the above-described problem, an object of the present disclosure is to provide a composite magnetic sheet including a first magnetic sheet part having a stacked structure of two or more unit magnetic sheets, and a second magnetic sheet part including a second magnetic sheet stacked on an outermost surface of the first magnetic sheet part, wherein porosity of each of the two or more unit magnetic sheets is greater than that of the second magnetic sheet on the basis of the same volume.

Advantageous Effects

In accordance with embodiments of the present disclosure, an independent soft magnetic sheet having a low surface roughness is stacked on an outermost surface of a soft magnetic sheet having a stacked structure, and thus composite sheets having the stacked structure, which have characteristics of different surface roughness or different porosity, can be implemented such that there is an effect of providing a composite magnetic sheet for electromagnetic shielding which has a structure capable of significantly enhancing reliability in an external hazardous environment such as salt water and the like while maintaining efficiency of the electromagnetic shielding.

Also, in accordance with the embodiments of the present disclosure, there is an effect of providing a magnetic sheet capable of being compatible with standards of various wireless power transmission methods, and implementing high power transmission efficiency in a power transmission method requiring a permanent magnet while minimizing influence of the permanent magnet.

DESCRIPTION OF DRAWINGS

FIGS. 3 and 4 show graphs, which are made by measuring transmission efficiency of a Tx-A11 type transmitter and a Tx-A1 type transmitter implementing a wireless charging module using the composite magnetic sheet according to the embodiment of the present disclosure, and a comparative experiment table between the Tx-A11 type transmitter and the Tx-A1 type transmitter.

MODES OF THE INVENTION

Figure 1:
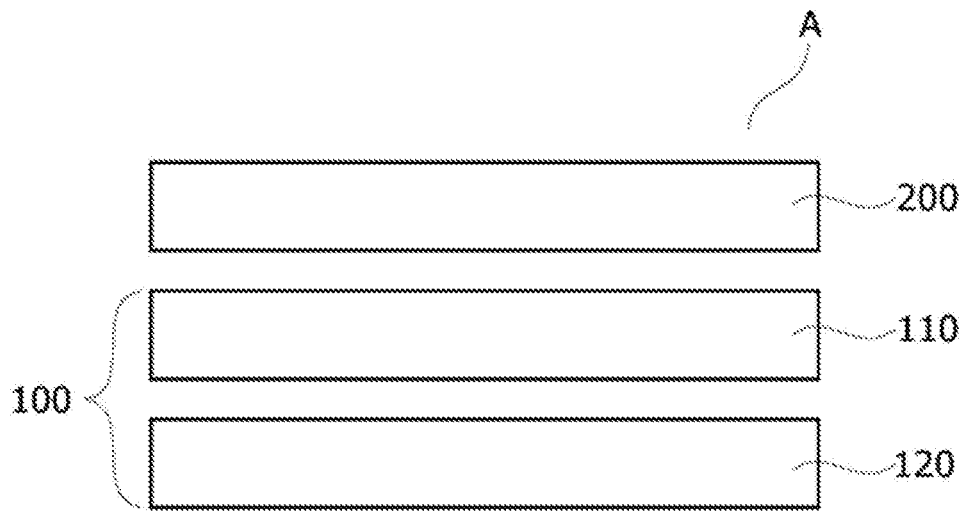
FIG. 1 is a conceptual diagram of a composite magnetic sheet according to the present disclosure.

Hereinafter, configurations and operations according to the present disclosure will be described in detail with reference to the accompanying drawings. In a description referring to the accompanying drawings, the same reference numbers designate the same components regardless of the reference number, and repetitive descriptions thereof will be omitted. Although the terms "first," "second," and the like may be used herein to describe various components, these components are not limited by these terms. These terms are used only for the purpose of distinguishing one component from another component.

Hereinafter, embodiments will be revealed through the description of the accompanying drawings and the embodiments. In the description of the embodiments, when each layer (or film), region, pattern, or structure is described to be formed as being "on" or "under" a substrate, the terms "on" and "under" should be construed as including each of the layers (or films), regions, pads, patterns, or structures being "directly on" or "directly under" the substrate, or connected to the substrate "by another layer being interposed therebetween (indirectly)." In the drawing, a thickness or a size of each layer is exaggerated, omitted, or schematically illustrated for the purpose of convenience or clarity of the description. In addition, a size of each component does not completely reflect the actual size thereof. Hereinafter, the embodiments will be described with reference to the accompanying drawings.

FIG. 1 is a conceptual diagram illustrating a cross section of a composite magnetic sheet according to an embodiment of the present disclosure.

Referring to the drawing, a composite magnetic sheet A according to the embodiment of the present disclosure may be configured to include a first magnetic sheet part 100 having a stacked structure of two or more unit magnetic sheets 110 and 120, and a second magnetic sheet part 200 including a second magnetic sheet which is stacked on an outermost surface of the first magnetic sheet part. In this case, surface roughness of each of the unit magnetic sheets may be implemented to be different from that of the second magnetic sheet.

Particularly, in the embodiment of the present disclosure, when assuming that porosity is based on an entire volume inside the unit magnetic sheets 110 and 120, the porosity may be formed to be larger than that included in an entire volume of the second magnetic sheet 200. In this case, the porosity is defined by a ratio of pores to the same volume. For this purpose, the ratio of pores may be increased by causing a fracture on a surface of each of the unit magnetic sheets 110 and 120 through a cracking process, or by applying physical stimuli that form pores at an inside of each of the unit magnetic sheets 110 and 120. For example, when the cracking process is performed on a surface, surface roughness becomes higher and inner porosity is increased. Also, in the case of a unit magnetic sheet in which porosity has been increased in association with the above-described cracking process, permeability is reduced and a relationship in which transmission efficiency is increased as the permeability is reduced is established.

As one example, the unit magnetic sheets 110 and 120 configure a two-sheet stacked structure as shown in the drawing, but two or more unit magnetic sheets may be stacked, and in this case, a physical pressure may be applied to any one or more sheets of the two or more unit magnetic sheets through the cracking process or a braking process to deform the stacked structure. The cracking process is a process capable of implementing surface patterning by applying pressure to a sheet or applying a constant crushing force to the surface to break an internal structure of the sheet and provide a sheet structure (hereinafter, referred to as a "cracked structure"), in which the cracked structure is included in the surface or inside of the sheet such that permeability may be reduced and transmission efficiency may be more increased.

In this case, the composite magnetic sheet A may be implemented to include a structure (hereinafter, referred to as a "non-cracked structure") in which a soft magnetic sheet layer that has not undergone the cracking process, the braking process, or the like is stacked on a surface of an uppermost portion or a lowermost portion of a stacked structure of a plurality of unit magnetic sheets, or on both of the surfaces of the uppermost portion and the lowermost portion.

A stacked structure of an outermost magnetic sheet layer having such a non-cracked structure may solve a problem in which penetration of salt water occurs in a subsequent process due to a cracked structure that is necessarily provided to adjust permeability in a stacked structure of a plurality of soft magnetic sheets, and may also solve a problem in which the cracked structure is exposed to an outer surface of a magnetic sheet and thus is damaged by a protection film and the like in a subsequent connecting process.

Specifically, a unit magnetic sheet having the cracked structure according to the embodiment of the present disclosure is implemented to have different permeability from that of a magnetic sheet having the non-cracked structure. More particularly, the unit magnetic sheet has a characteristic in which permeability is relatively lower than that of the magnetic sheet having the non-cracked structure, and porosity inside the unit magnetic sheet having the cracked structure shows a characteristic in which the porosity is relatively higher than that of the magnetic sheet having the non-cracked structure. Therefore, in the embodiment of the present disclosure, the porosity of the unit magnetic sheet is implemented to be higher than that of the second magnetic sheet such that, in this regard, the unit magnetic sheet is implemented to have a characteristic in which a permeability of the unit magnetic sheet is lower than that of the second magnetic sheet.

In the structure of FIG. 1, at least one among the plurality of unit magnetic sheets configuring the first magnetic sheet part may be preferably implemented to have the cracked structure, and thus each of the plurality of unit magnetic sheets may have a different surface roughness and different porosity and may be implemented with a different material. Of course, it may implement a stacked structure of a plurality of unit magnetic sheets which are formed of the same material in a structure in which each of the plurality of unit magnetic sheets has different surface roughness and different porosity.

In this case, it is preferable for a thickness of the unit magnetic sheet in the embodiment of the present disclosure to satisfy the range of 18 to 200 μm, and, in terms of a level of efficiency capable of maintaining an electromagnetic shielding characteristic and preventing an effect of the penetration of salt water, it is preferable to implement the number of unit magnetic sheets to be in the range of 2 to 30 layers to satisfy a range of thickness of the magnetic sheet according to the present disclosure.

Also, the unit magnetic sheet or the second magnetic sheet according to the embodiment of the present disclosure may be made of a metallic-alloy based magnetic powder consisting of one element or a combination of two or more elements selected from Fe, Ni, Co, Mo, Si, Al, and B, a polymer composite material, or a metallic-alloy based magnetic ribbon. In the present disclosure, a "ribbon" collectively refers to an amorphous or crystalline metallic alloy in the form of a very thin "band," "strap," or "chain".

Additionally, the "ribbon" defined in the present disclosure is principally a metallic alloy, but the term "ribbon" may be separately used due to an appearance shape, Fe(Co)—Si—B may be used as a main material of the ribbon, and the ribbon may be manufactured in various compositions by adding an additive including Nb, Cu, Ni, and the like. In a broad sense, fiber, vinyl, plastic, a metal, an alloy, and the like may be used as an applicable material, but in daily life, a fiber form or a vinyl form may be mainly manufactured and may be widely used for the purpose of binding or decorating an object.

Alternatively, the unit magnetic sheet or the second magnetic sheet according to the embodiment of the present disclosure may be made of a ferrite powder consisting of a combination of two or more elements selected from Fe, Ni, Mn, Zn, Co, Cu, Ca, and O, a polymer composite material, or a ferrite-based sintered material, and may be implemented in the form of a sheet structure. For example, the magnetic sheet according to the present disclosure may be configured with Fe—Si—B and a MnZn based ferrite.

In this case, porosity included in the unit magnetic sheet according to the embodiment of the present disclosure may satisfy the range of 0.5% to 3% based on an entire volume of a single unit magnetic sheet, and more preferably, may be provided in the range of 1% to 2%. In the above-described range, transmission efficiency may be maximized, resistance against salt water vulnerability may be provided, and versatility of usage may be secured according to whether a permanent magnet exists.

Figure 2:
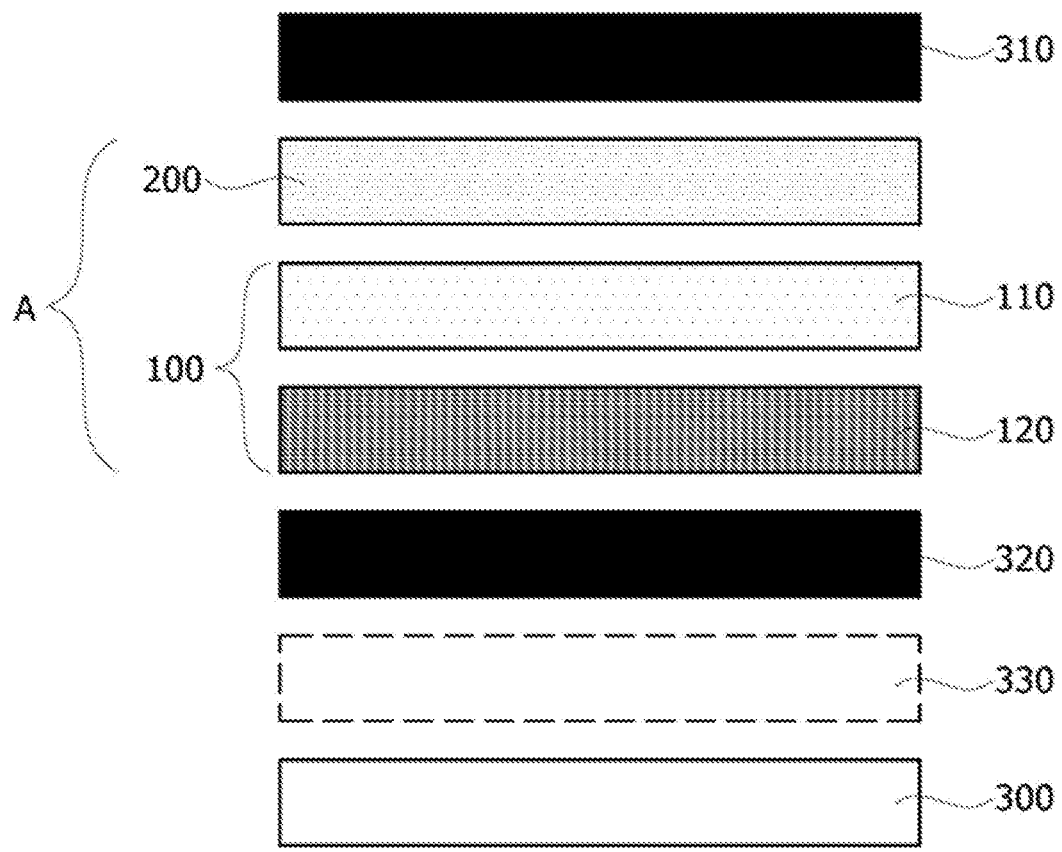
FIG. 2 is a conceptual diagram of a configuration of a wireless charging module including the composite magnetic sheet according to the embodiment of the present disclosure.

FIG. 2 is a conceptual diagram schematically illustrating a configuration of a wireless charging module including the structure of the composite magnetic sheet according to the above-described embodiment of the present disclosure.

In other words, as described above, the composite magnetic sheet A according to the present disclosure may include the first magnetic sheet part 100 having the cracked structure and the second magnetic sheet part 200 having the non-cracked structure which is formed at the outermost surface of the first magnetic sheet part 100, and, as shown in the drawing, the wireless charging module may be implemented with a structure in which a coil part 300 for wireless charging or near field communication (NFC) is disposed on the first magnetic sheet part. In this case, an insulating member may be additionally included between the composite magnetic sheet A according to the present disclosure and the coil part 300. According to an aspect of a usage embodiment, the insulating member may be disposed as shown in FIG. 2, and the wireless charging module may be implemented with a protective member 320 or an adhesive member 330.

As one example, one or more protective members 310 and 320 may be additionally included at a surface of the composite magnetic sheet A according to the present disclosure, and the adhesive member 330, which includes an adhesive film and the like for adhering the coil part 300 to the composite magnetic sheet A, may be additionally included.

Figure 3:
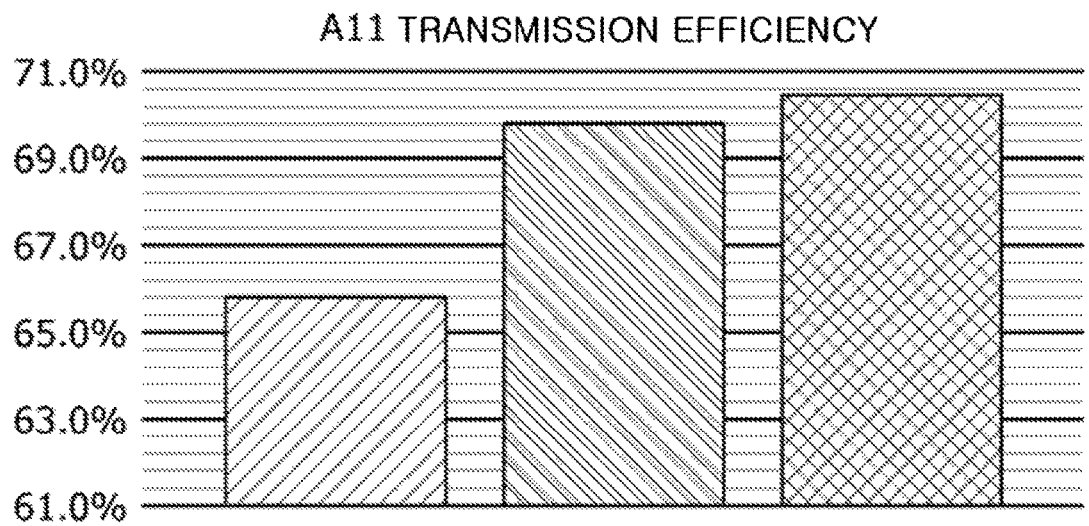
Figure 3:
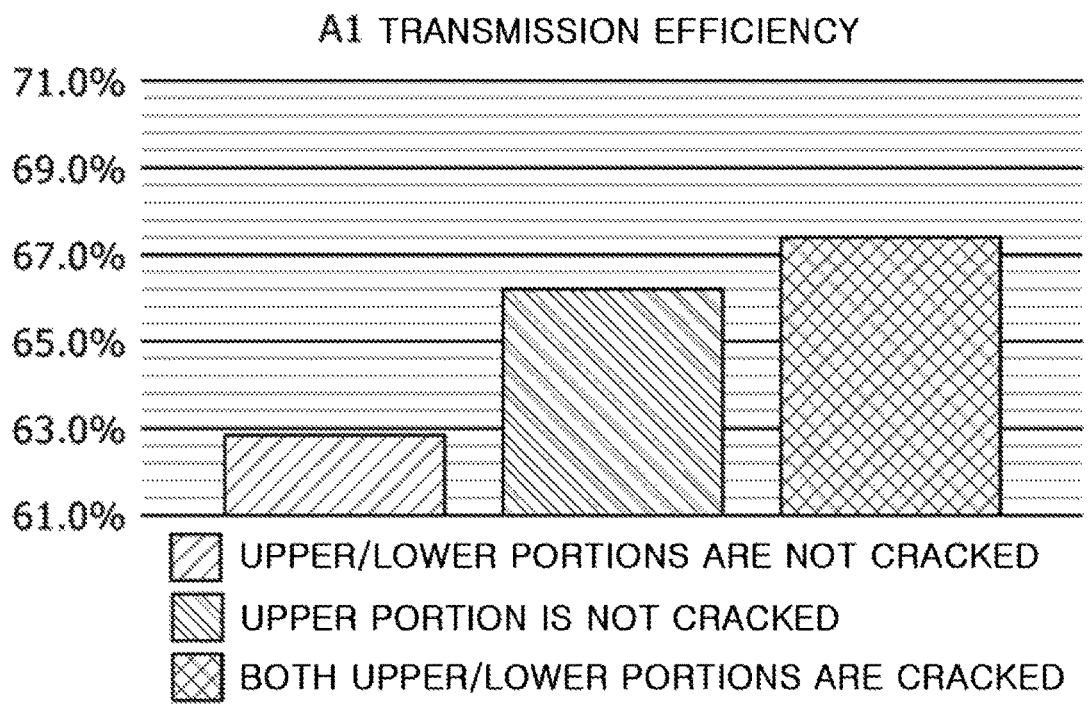

FIGS. 3 and 4 shows graphs, which is made by measuring transmission efficiency of a Tx-A11 type transmitter and a Tx-A1 type transmitter implementing a wireless charging module using the composite sheet according to the embodiment of the present disclosure, and a comparative experiment table between the Tx-A11 type transmitter and the Tx-A1 type transmitter. [Tx-A1 (a typical standard of a permanent magnet mounted type transmitter) and Tx-A11 (a typical standard of a transmitter without a permanent magnet)]

A comparison group for the composite magnetic sheet in a structure of each of the Tx-A1 type transmitter and the Tx-A11 type transmitter is classified into a structure in which a magnetic sheet layer having the non-cracked structure implemented at the upper and lower portions of the unit magnetic sheet of the first magnetic sheet part in the structure of FIG. 1 (that is, having non-cracked structures at the upper and lower portions), a structure in which the second magnetic sheet having the non-cracked structure implemented at only the upper portion of the unit magnetic sheet of the first magnetic sheet part (that is, having non-cracked structures at the upper portion), and a structure in which the cracked structure is implemented at both the upper and lower portions of the unit magnetic sheet (that is, cracked structures at both the upper and lower portions), and then transmission efficiency is compared among the above-described structures in each of the Tx-A1 type transmitter and the Tx-A11 type transmitter.

As shown in the drawing, transmission efficiency of the structure, "in which the cracked structure is implemented at both the upper and lower portions of the unit magnetic sheet (that is, both the upper and lower portions are cracked)," is highest in both the Tx-A11 type transmitter and the Tx-A1 type transmitter, and transmission efficiency of the structure, "in which the second magnetic sheet having the non-cracked structure implemented at only the upper portion of the unit magnetic sheet of the first magnetic sheet part (that is, the upper portion is not cracked), is also measured to be high at 66.3% and 69.9% in both the Tx-A1 type transmitter and the Tx-A11 type transmitter. On the other hand, transmission efficiency is measured to be low in the structure in which the magnetic sheet layer having the non-cracked structure implemented at the upper and the lower portions of the unit magnetic sheet of the first magnetic sheet part (that is, both the upper and lower portions are not cracked).

Specifically, in the structure "in which the cracked structure is implemented at the upper and lower portions of the unit magnetic sheet (that is, both the upper and lower portions are cracked)," and the structure "in which the second magnetic sheet having the non-cracked structure implemented at only the upper portion of the unit magnetic sheet of the first magnetic sheet part (that is, the upper portion is not cracked)," when a volume of the first magnetic sheet part exceeds 80% of an entire volume of the composite magnetic sheet on the basis of the entire volume, the transmission efficiency is drastically reduced. Therefore, in the composite magnetic sheet according to the embodiment of the present disclosure, the volume of the first magnetic sheet part may be preferably formed to be less than or equal to 80% of the entire volume of the composite magnetic sheet on the basis of the entire volume. That is, when the volume of the first magnetic sheet part is in the range of 70% to 80% based on the entire volume of the composite magnetic sheet, the transmission efficiency may be higher, and particularly, when the volume of the first magnetic sheet part occupies the range of 74% to 77%, the transmission efficiency may be maximally implemented while also securing strong performance against a corrosion characteristic.

Additionally, in a stacked structure of two or more unit magnetic sheets, a volume of an air gap existing between layers which are stacked may be provided to be in the range of 1% to 5% when compared to the entire volume of the composite magnetic sheet, and particularly, when the air gap is formed to have a volume in the range of 2% to 3%, stable performance may be secured in terms of the transmission efficiency.

In terms of performance of the transmission efficiency, it may be preferable for an entire occupation rate of an insulating layer, which includes an adhesive layer and the like between layers in the composite magnetic sheet, to fall into the range of 16% to 25% when compared to the entire volume of the composite magnetic sheet, and particularly, fall into the range of 19% to 22%.

Figure 5:
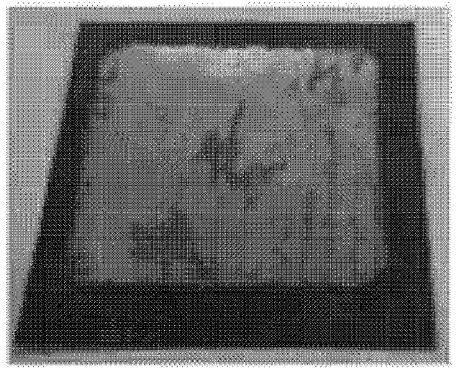
FIG. 5 is an image illustrating an experimental result of salt water permeability in a structure "in which a cracked structure has been implemented at both upper and lower portions of a unit magnetic sheet part (that is, both the upper and lower portions are cracked)."
Figure 6:
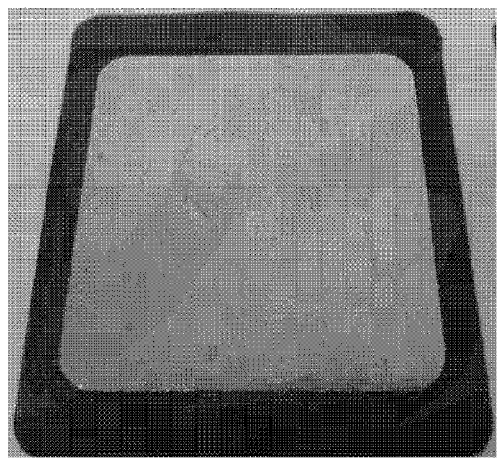
FIG. 6 is an image illustrating an experimental result of salt water permeability in a structure "in which a second magnetic sheet having a non-cracked structure implemented at only an upper portion of a unit magnetic sheet part of a first magnetic sheet part (that is, the upper portion is not cracked)."

Referring to FIGS. 5 and 6, from the embodiments described with reference to FIGS. 3 and 4, FIG. 5 is an image of an experimental result of salt water permeability in the structure "in which the cracked structure is implemented at both upper and lower portions of the unit magnetic sheet (that is, both the upper and lower portions are cracked)," and FIG. 6 is an image of an experimental result of salt water permeability in the structure "in which the second magnetic sheet having the non-cracked structure implemented at only the upper portion of the unit magnetic sheet of the first magnetic sheet part (that is, the upper portion is not cracked)."

As shown in FIG. 5, it can be seen that the transmission efficiency is significantly higher in the structure "in which the cracked structure is implemented at both the upper and lower portions of the unit magnetic sheet (that is, both the upper and lower portions are cracked)," whereas a corrosion characteristic is extremely degraded in that structure such that corrosion occurs.

On the other hand, it can be seen from FIG. 6 that the structure, "in which the second magnetic sheet having the non-cracked structure implemented at only the upper portion of the unit magnetic sheet of the first magnetic sheet part (that is, the upper portion is not cracked)," which is the same as the embodiment of the present disclosure may be implemented to have high transmission efficiency, and strong resistance against salt water permeability or corrosion, thereby providing reliable quality.

As described above, in accordance with the present disclosure, an independent soft magnetic sheet having a low surface roughness and a non-cracked structure is stacked on an outermost surface of a soft magnetic sheet having a stacked structure, and thus composite sheets having characteristics of different surface roughness or different porosity and the stacked structure are implemented such that a characteristic capable of significantly enhancing reliability may be implemented in an external hazardous environment such as salt water and the like while maintaining efficiency of the electromagnetic shielding.

In the detailed description of the present disclosure as described above, concrete embodiments have been described. However, various modifications may be made without departing from the scope of the present disclosure. Therefore, the technical spirit of the present disclosure is not limited to the embodiments described herein, and should be determined by the appended claims as well as equivalents to which such claims are entitled.

The invention claimed is:

1. A wireless charging module comprising:
a composite magnetic sheet;
protective members disposed on an upper portion and a lower portion of the composite magnetic sheet; and
a coil disposed on the composite magnetic sheet,
wherein the composite magnetic sheet comprises:
a first magnetic sheet part having a stacked structure of two or more magnetic sheets; and
a second magnetic sheet disposed on the first magnetic sheet part,
wherein the first magnetic sheet part and the second magnetic sheet include a same material,
wherein at least one magnetic sheet of the first magnetic sheet part includes a crack, and
the second magnetic sheet does not include the crack,
wherein the second magnetic sheet is disposed on one outermost part of the composite magnetic sheet.

2. The wireless charging module of claim 1, wherein the at least one magnetic sheet including the crack of the first magnetic sheet part is disposed on the other outermost part of the composite magnetic sheet.

3. The wireless charging module of claim 1, wherein a volume of the first magnetic sheet part is in a range of 70% to 80% of a volume of the composite magnetic sheet.

4. The wireless charging module of claim 1, wherein a thickness of at least one magnetic sheet of the first magnetic sheet part is 18 μm to 200 μm.

5. The wireless charging module of claim 1, wherein the first magnetic sheet part and the second magnetic sheet include Fe and Si.

6. The wireless charging module of claim 1, wherein all magnetic sheets of the first magnetic sheet part include the crack.

7. The wireless charging module of claim 1, further comprising adhesive members disposed between magnetic sheets of the first magnetic sheet part and between the first magnetic sheet part and the second magnetic sheet.

8. The wireless charging module of claim 1, wherein the coil is disposed on the first magnetic sheet part, and the first magnetic sheet part is disposed between the coil and the second magnetic sheet.

9. A magnetic sheet for wireless charging comprising:
a composite magnetic sheet; and
protective members disposed on an upper portion and a lower portion of the composite magnetic sheet,
wherein the composite magnetic sheet comprises:
a first magnetic sheet part having a stacked structure of two or more magnetic sheets; and
a second magnetic sheet disposed on the first magnetic sheet part,
wherein the first magnetic sheet part and the second magnetic sheet include a same material,
wherein a surface roughness or a porosity of at least one magnetic sheet of the first magnetic sheet part is greater than the surface roughness or the porosity of the second magnetic sheet,
wherein the at least one magnetic sheet of the first magnetic sheet part includes a crack pattern,
wherein the second magnetic sheet is one outermost sheet of the composite magnetic sheet, and
wherein one magnetic sheet including the crack pattern of the first magnetic sheet part is the other outermost sheet of the composite magnetic sheet.

10. The magnetic sheet for wireless charging of claim 9, wherein the second magnetic sheet does not include the crack pattern.

11. The magnetic sheet for wireless charging of claim 9, wherein a volume of the first magnetic sheet part is in a range of 70% to 80% of a volume of the composite magnetic sheet.

12. The magnetic sheet for wireless charging of claim 9, wherein a thickness of at least one magnetic sheet of the first magnetic sheet part is 18 μm to 200 μm.

13. The magnetic sheet for wireless charging of claim 9, wherein the first magnetic sheet part and the second magnetic sheet include Fe and Si.

14. The magnetic sheet for wireless charging of claim 9, wherein all magnetic sheets of the first magnetic sheet part include the crack pattern.

15. The magnetic sheet for wireless charging of claim 9, further comprising adhesive members disposed between magnetic sheets of the first magnetic sheet part and between the first magnetic sheet part and the second magnetic sheet.

16. The magnetic sheet for wireless charging of claim 9, further comprising adhesive members disposed between magnetic sheets of the first magnetic sheet part and between the first magnetic sheet part and the second magnetic sheet, and
wherein the first magnetic sheet part and the second magnetic sheet include Fe and Si.

17. A wireless charging module comprising:
a composite magnetic sheet;
protective members disposed on an upper portion and a lower portion of the composite magnetic sheet; and
a coil disposed on the magnetic sheet,
wherein the composite magnetic sheet comprises:
a first magnetic sheet part having a stacked structure of two or more magnetic sheets; and
a second magnetic sheet disposed on the first magnetic sheet part,
wherein the first magnetic sheet part and the second magnetic sheet include a same material,
wherein a surface roughness or a porosity of at least one magnetic sheet of the first magnetic sheet part is greater than the surface roughness or the porosity of the second magnetic sheet,
wherein the at least one magnetic sheet of the first magnetic sheet part includes a crack pattern,
wherein the second magnetic sheet is one outermost sheet of the composite magnetic sheet,
wherein a volume of the first magnetic sheet part is in a range of 70% to 80% of a volume of the composite magnetic sheet, and
wherein one magnetic sheet including the crack pattern of the first magnetic sheet part is the other outermost sheet of the composite magnetic sheet.

18. The wireless charging module of claim 17, wherein the coil is disposed on the first magnetic sheet part, and the first magnetic sheet part is disposed between the coil and the second magnetic sheet.

* * * * *